(12) United States Patent
Kitaoka et al.

(10) Patent No.: US 7,419,545 B2
(45) Date of Patent: Sep. 2, 2008

(54) METHOD FOR PRODUCING SILICON CARBIDE (SIC) SINGLE CRYSTAL AND SILICON CARBIDE (SIC) SINGLE CRYSTAL OBTAINED BY SUCH METHOD

(75) Inventors: Yasuo Kitaoka, Osaka (JP); Yusuke Mori, Osaka (JP); Takatomo Sasaki, Osaka (JP); Fumio Kawamura, Osaka (JP); Minoru Kawahara, Osaka (JP)

(73) Assignees: Matsushita Electric Industrial Co., Ltd., Osaka (JP); Osaka University, Osaka (JP)

( * ) Notice: Subject to any disclaimer, the term of this patent is extended or adjusted under 35 U.S.C. 154(b) by 50 days.

(21) Appl. No.: 10/599,035

(22) PCT Filed: Dec. 26, 2005

(86) PCT No.: PCT/JP2005/023798

§ 371 (c)(1),
(2), (4) Date: Sep. 18, 2006

(87) PCT Pub. No.: WO2006/070749

PCT Pub. Date: Jul. 6, 2006

(65) Prior Publication Data

US 2007/0221122 A1    Sep. 27, 2007

(30) Foreign Application Priority Data

Dec. 28, 2004   (JP) .............................. 2004-380168

(51) Int. Cl.
*C30B 15/20* (2006.01)
(52) U.S. Cl. ................... 117/15; 117/13; 117/217; 117/218; 117/222
(58) Field of Classification Search ............... 23/301 R; 117/68, 71, 79, 109, 951, 952, 13, 15, 217, 117/218, 222; 252/62.3 C
See application file for complete search history.

(56) References Cited

U.S. PATENT DOCUMENTS

| 3,053,635 A | 9/1962 | Shockley |
| 3,669,763 A | 6/1972 | Perusek |
| 4,349,407 A | 9/1982 | Lundberg |
| 4,702,901 A | 10/1987 | Shalek |
| 5,718,760 A | 2/1998 | Carter et al. |
| 5,968,265 A | 10/1999 | Stein et al. |
| 2005/0183657 A1 | 8/2005 | Kusunoki et al. |

FOREIGN PATENT DOCUMENTS

| JP | 56-96799 | 8/1981 |
| JP | 56-96883 | 8/1981 |
| JP | 58-156597 | 9/1983 |
| JP | 2000-256091 | 9/2000 |
| JP | 2000-264790 | 9/2000 |
| JP | 2001-106600 | 4/2001 |
| JP | 2002-326897 | 11/2002 |
| JP | 2002-356397 | 12/2002 |
| JP | 2004-2173 | 1/2004 |

*Primary Examiner*—Felisa C Hiteshew
(74) *Attorney, Agent, or Firm*—Hamre, Schumann, Mueller & Larson, P.C.

(57) ABSTRACT

The present invention provides a producing method with which large silicon carbide (SiC) single crystal can be produced at low cost. Silicon carbide single crystal is produced or grown by dissolving and reacting silicon (Si) and carbon (C) in an alkali metal flux. The alkali metal preferably is lithium (Li). With this method, silicon carbide single crystal can be produced even under low-temperature conditions of 1500° C. or lower, for example. The photograph of FIG. 3B is an example of a silicon carbide single crystal obtained by the method of the present invention.

18 Claims, 7 Drawing Sheets

←→ 1mm

←→ 300μm

METHOD FOR PRODUCING SILICON CARBIDE (SIC) SINGLE CRYSTAL AND SILICON CARBIDE (SIC) SINGLE CRYSTAL OBTAINED BY SUCH METHOD

TECHNICAL FIELD

The present invention relates to a method for producing silicon carbide (SiC) single crystal, and to silicon carbide (SiC) single crystal obtained by this method.

BACKGROUND ART

Silicon carbide (SiC) single crystal is a promising semiconductor material that has a wide bandgap, high thermal conductivity, a high insulating electric field, and a high saturated electron velocity. Because of these characteristics, a semiconductor device produced of silicon carbide single crystal is able to operate at high speed and a high output level at a high operating temperature, so such semiconductor devices are promising for use in onboard power devices and energy devices, for example.

Methods conventionally known for growing silicon carbide single crystals include sublimation, the Atchison process, and liquid phase growth. Sublimation is a method in which SiC is used as the raw material, which is heated and sublimated to precipitate single crystal on a low-temperature component. The Atchison process involves reacting carbon and silica at a high temperature. Liquid phase growth is a method in which a silicon compound is dissolved in a carbon crucible, carbon and silicon are reacted at a high temperature, and single crystal is precipitated. However, each of these conventional methods had its problems, as discussed below. First of all, a problem that these methods have in common is that a high temperature is required for crystal growth. In addition, a problem in the quality of the resulting crystals with sublimation is that the resulting single crystals include numerous micropipes, stacking faults, and so forth. That is, in the course being sublimated, the raw material becomes silicon, $SiC_2$, and $Si_2C$ and vaporizes, and it is difficult to control the partial pressures of these gases and keep them at the stoichiometric composition, and this is believed to be the cause of the above-mentioned defects. Also, with liquid phase growth, it is difficult to grow large crystals because of the small amount of carbon that dissolves into the silicon melt.

In an effort to solve the above problems, methods have been reported in recent years in which SiC single crystal is produced by a liquid phase growth method in which a melt is obtained by melting silicon, carbon, and a transition metal, and a seed crystal is brought into contact with this melt (see, for example, Patent Documents 1, 2, and 3). With these methods, a raw material with a composition of $Si_{0.8}Ti_{0.2}$ is put into a graphite crucible, the crucible is heated to 1850° C. in an argon atmosphere under atmospheric pressure to dissolve the raw material, and the temperature then is held at 1850° C. for 5 hours so that the graphite will dissolve into this melt. After this, a 6H—SiC seed crystal is immersed in the melt, the melt is cooled to 1650° C. at a rate of 0.5° C./min, and crystal is grown. It has been reported that SiC crystal with a thickness of 732 μm was formed with this method. Nevertheless, even with this method there is the problem in that a high temperature is required for crystal growth. Specifically, since the melting point of silicon is 1414° C., the melting point of carbon is 3500° C., the melting point of titanium is 1675° C., and the melting point of SiC is 2545° C., the temperature must be at least 1700° C. In particular, when a transition metal such as titanium is used, growing crystals at low temperature is difficult because of how high these melting points are.

Another method that has been reported is one in which 3C—SiC single crystal is produced by a liquid phase growth method in which SiC is used as the raw material and a crystal is grown (Patent Document 4), but this requires treatment at a high temperature to obtain single crystal of high quality. Meanwhile, it is generally believed that for a high-quality SiC single crystal substrate to be produced at a low cost, the single crystal must be produced under low temperature conditions of 1500° C. or lower.

Patent Document 1: JP 2000-264790A
Patent Document 2: JP 2002-356397A
Patent Document 3: JP 2004-2173A
Patent Document 4: U.S. Pat. No. 4,349,407

DISCLOSURE OF INVENTION

Problem to be Solved by the Invention

In view of this, it is an object of the present invention to provide a method for producing silicon carbide single crystal, with which large silicon carbide (SiC) single crystal can be produced at a low cost.

Means for Solving Problem

To achieve the stated object, the producing method of the present invention is a method in which silicon (Si) and carbon (C) are dissolved in an alkali metal flux, and are reacted to produce or grow silicon carbide single crystal.

Also, the silicon carbide single crystal of the present invention is one that is obtained by the above-mentioned producing method of the present invention.

Effect of the Invention

Thus, with the producing method of the present invention, because silicon and carbon are dissolved in an alkali metal flux and then reacted, silicon carbide single crystal can be produced even under low temperature conditions (such as 1500° C. or lower), for example. Accordingly, the producing method of the present invention allows large silicon carbide single crystal to be produced at a low cost.

KEY

Figure 1A:
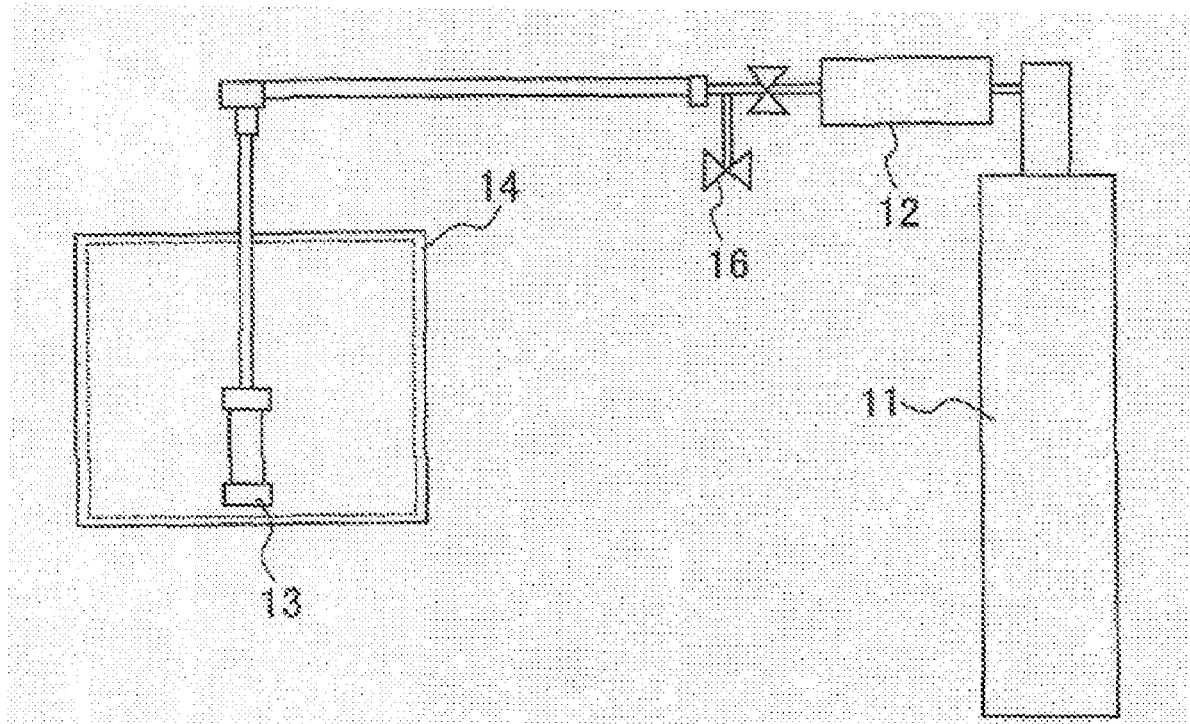
FIG. 1A is a schematic view showing the configuration of an example of the producing apparatus used in the producing method of the present invention.

| | |
|---|---|
| 11 | gas cylinder |
| 12 | pressure regulator |
| 13 | pressure- and heat-resistant vessel |
| 14 | electric furnace |
| 15 | crucible |
| 16 | leak valve |

BEST MODE FOR CARRYING OUT THE INVENTION

With the producing method of the present invention, the silicon carbide single crystal preferably is produced or grown by cooling the alkali metal flux in which the silicon and the carbon have been dissolved. Specifically, it is preferable, for example, if the silicon, the carbon, and the alkali metal are heated so as to dissolve the silicon and the carbon in the alkali metal flux, and this heating state is maintained for a specific length of time, after which the heating temperature is lowered to cool the alkali metal flux. This method hereinafter will be referred to as the "temperature lowering method." In this temperature lowering method, there is no particular limitation on the initial temperature of the heating treatment (growth initial temperature), the final temperature after lowering, the temperature lowering speed, and so forth, all of which may be selected as appropriate.

With the producing method of the present invention, it is preferable that a temperature gradient is formed in the alkali metal flux, the silicon and the carbon are dissolved in the high-temperature region of the temperature gradient, and the silicon carbide single crystal is produced or grown in the low-temperature region of the temperature gradient. This method hereinafter will be referred to as the "temperature gradient method." In this temperature gradient method, there is no particular limitation on the temperatures in the high and low temperature regions, both of which may be selected as appropriate.

With the producing method of the present invention, it is preferable that the alkali metal flux includes lithium (Li), and particularly if it is a flux of lithium alone. The present invention is not limited to this, however, and the flux may include other alkali metals such as sodium (Na) or potassium (K), or other elements such as an alkaline earth metal (such as calcium (Ca)).

With the producing method of the present invention, it is preferable that the single crystal is produced or grown under a heated atmosphere. The heating temperature is, for example, 1500° C. or lower, and preferably between 200 and 1500° C., and even more preferably between 400 and 1500° C., and still more preferably between 600 and 1400° C. The heating temperature can be selected suitably as dictated by the composition of the flux, but it preferably is under the boiling point of the elements that make up the main component of the flux, because this allows the evaporation of the flux main component to be suppressed better.

With the producing method of the present invention, it is preferable that the growth or production of the single crystal is conducted under a pressurized atmosphere, as described below. The pressure here is, for example, between 0.1 and 100 MPa, and preferably between 0.1 and 10 MPa, and even more preferably between 0.1 and 1 MPa. Also, it is preferable that the growth or production of the single crystal is conducted under an inert gas atmosphere. Examples of the inert gas include argon (Ar) gas and hydrocarbon gases such as methane and propane, but argon gas is preferable.

With the producing method of the present invention, there is no particular limitation on the proportions of the carbon, silicon, and the alkali metal that is the flux component. For instance, if lithium alone is used as the flux component, the proportions (molar ratio) of lithium, silicon, and carbon may be Li:Si:C=1:(0.01 to 100):(0.01 to 100), and preferably, Li:Si:C=1:(0.01 to 10):(0.01 to 10), and even more preferably, Li:Si:C=1:(0.01 to 1):(0.01 to 1).

With the producing method of the present invention, it is preferable that the reaction is conducted in a reaction vessel, and the carbon is supplied from the material of which the reaction vessel is made.

With the producing method of the present invention, it is preferable that a silicon carbide crystal that has been readied in advance is used as a seed crystal, and this seed crystal is used as a nucleus to grow new silicon carbide single crystal. The seed crystal preferably is in the form of a substrate, in which case it may be, for example, one in which a silicon carbide crystal is formed as a thin film on the surface of a substrate of a different material. The silicon carbide crystal that serves as the seed crystal preferably is, for example, 6H—SiC crystal, 4H—SiC crystal, or the like, and in the producing method of the present invention, it is preferable to produce 2H—SiC single crystal on 6H—SiC crystal substrate. A commercially available silicon carbide crystal or carbide crystal substrate also can be used as the seed crystal.

Examples of the silicon carbide single crystal obtained by the producing method of the present invention include 6H—SiC single crystal, 4H—SiC single crystal, 3C—SiC single crystal, and 2H—SiC single crystal. Of these, 2H—SiC single crystal is particularly preferable because of its superior practicality, due to its having the largest bandgap and high electron mobility. In the present invention, "2H—SiC single crystal," for example, refers for practical purposes to any crystal that can be used as 2H—SiC single crystal, and is not strictly limited to a crystal formed from 2H—SiC alone. The same applies to 3C—SiC single crystal and other single crystals.

Also, the producing method of the present invention can be used, for example, in the produce of semiconductor devices. That is, if silicon carbide single crystal is formed on a substrate by using the producing method of the present invention in the produce of a semiconductor device, a semiconductor device that includes a silicon carbide single crystal layer can be produced at low cost. Examples of the above-mentioned substrate include 6H—SiC crystal substrate and 4H—SiC crystal substrate, and the above-mentioned silicon carbide single crystal preferably is 2H—SiC single crystal, for example.

Next, the silicon carbide single crystal of the present invention is silicon carbide single crystal obtained by the above-mentioned producing method of the present invention. This silicon carbide single crystal is of higher quality than one produced by a conventional method.

An example of the producing method of the present invention will now be described.

Figure 1B:
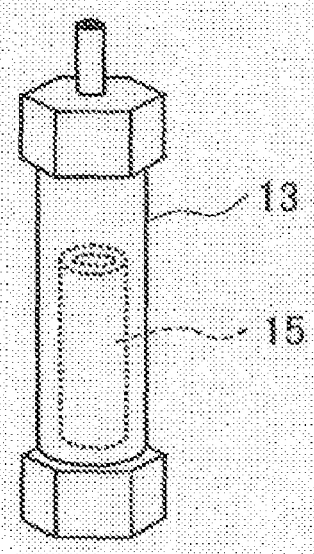
FIG. 1B is an enlarged oblique view of the pressure- and heat-resistant vessel in this producing apparatus.

FIGS. 1A and 1B illustrate an example of the apparatus used in the producing method of the present invention. As shown in FIG. 1A, this apparatus is made up of a gas cylinder 11, a pressure regulator 12, an electric furnace 14, and a pressure- and heat-resistant vessel 13. The pressure- and heat-resistant vessel 13 is disposed inside the electric furnace 14, and a crucible 15 is disposed inside the pressure- and heat-resistant vessel 13 (FIG. 1B). Silicon and carbon that are the raw materials, and a flux component are disposed in the crucible 15. The gas cylinder 11 is linked by a pipe to the pressure- and heat-resistant vessel 13, the pressure regulator 12 is disposed somewhere along the pipe, the gas cylinder 11 is filled with an inert gas such as argon (Ar), for example, and the pressure of the gas is adjusted to between 1 and 100 atm (0.1 to 10 MPa), for example, by the pressure regulator 12 before being supplied to the pressure- and heat-resistant vessel 13. Evaporation of the flux component (such as lithium) can be suppressed by using a pressurized atmosphere. In FIG. 1A, reference numeral 16 is a leak valve. An example of the electric furnace 14 is a resistance heater, but the furnace may consist of a resistance heater and a heat insulating material. The heating element of the above-mentioned resistance heater can be $MoSi_2$ or the like, for example, when heating up to 1500° C. The heating element of the above-mentioned resistance heater can be a kanthal wire or the like, for example, when heating to 1000° C. or lower, so the structure of the apparatus is extremely simple. The pressure- and heat-resistant vessel 13 is a stainless steel vessel, for example, and is heated in the electric furnace 14. The vessel disposed inside the electric furnace 14 is not limited to a pressure- and heat-resistant vessel, though, and any heat-resistant vessel can be used by adjusting the difference between the pressure inside the electric furnace and the pressure inside the vessel disposed in the electric furnace, for example. The material of which the crucible 15 is made can be, for example, tungsten (W), stainless steel, or other such material that is resistant to lithium metal. The crucible 15 may be a crucible formed from graphite or another carbon-based material, or a crucible formed from graphite or another carbon-based material may be disposed inside a crucible formed from a material that is resistant to lithium metal, for example. When a crucible thus formed from a carbon-based material is used, the carbon that serves as the crystal raw material can be supplied from the crucible material. Also, with the present invention, another component besides silicon and so forth can be disposed in the crucible 16; for instance, an impurity may be added as dopant. Examples of p-type doping materials include aluminum and boron, and examples of n-type doping materials include nitrogen and phosphorus.

SiC single crystal can be produced as follows using this apparatus. First, in a glovebox, lithium, silicon, and carbon are weighed out and put in the crucible 15, and the crucible 15 then is placed inside the pressure- and heat-resistant vessel 13. Argon gas then is supplied from the gas cylinder 11 into the pressure- and heat-resistant vessel 13. The system is adjusted here to a specific pressure by the pressure regulator 12. The inside of the pressure- and heat-resistant vessel 13 is heated by the electric furnace 14, whereupon the lithium, whose boiling point is 1327° C., dissolves inside the crucible 15 to form a flux (melt), into which the silicon and carbon dissolve. The heating temperature is 1500° C. or lower, for example, and preferably under the boiling point of the lithium, and even more preferably 1000° C. or lower, and still more preferably 950° C. or lower, and 850° C. or lower. The melt temperature can be raised further by increasing the atmosphere pressure, for example, and this allows the degree of dissolution of the silicon and carbon further to be raised. The atmosphere pressure is as discussed above. In addition to argon gas, the atmosphere gas can be, for example, methane, propane, or other such hydrocarbon gas. When the temperature lowering method discussed above is employed, for example, the temperature of the melt is held steady while the silicon and carbon are allowed to dissolve thoroughly, after which the melt temperature is lowered to produce or grow SiC single crystal. The temperature at which the melt is held is, for example, between 200 and 1500° C., and preferably 1000° C. or lower, and even more preferably 950° C. or lower, and 850° C. or lower. The temperature lowering rate (temperature lowering speed) preferably is a constant rate, for example, and a range of 0.1 to 100° C./hour is preferable, for example. Besides this, as in the above-mentioned temperature gradient method, a temperature gradient can be formed in the flux, and the dissolution of the crystal raw materials can be carried out simultaneously with the production or growth of the single crystal. With this temperature gradient method, for example, regions with two different temperatures are provided in the above-mentioned flux, such as a temperature region in which the crystal raw materials dissolve (high temperature region) and a temperature region in which the single crystal is produced or grown (low temperature region). The temperature differential between the high temperature region and low temperature region preferably is between 10 and 500° C., for example. When a seed crystal is used, this seed crystal and its surroundings preferably are in the low temperature region. The following is an example of how a temperature gradient can be formed in the flux. First, the bottom of the crucible containing the flux (melt) is filled with silicon and carbon (raw materials), and a silicon carbide (seed crystal) is fixed at the top of the crucible. The heater is given two different heating zones, forming a temperature differential between the bottom of the crucible, where the raw materials are located, and the growth section where the seed crystal is fixed. The bottom of the crucible is set to a high temperature, and the growth section is set to a low temperature, so that the silicon and carbon dissolve into the flux (melt) and react, and single crystal is grown on the seed crystal in the low temperature section.

When 2H—SiC single crystal is produced by the producing method of the present invention, the heating temperature in the growth region preferably is 600 to 850° C., for example, and even more preferably 700 to 850° C. When single crystal is grown by the above-mentioned temperature lowering method, the initial growth temperature preferably is 750 to 850° C., for example, and even more preferably 800 to 850° C. This initial temperature preferably is held for 1 to 100 hours, for example, and even more preferably 10 to 50 hours. The temperature then is gradually lowered from the initial temperature while the single crystal is grown, and the final temperature preferably is set to between 600 and 800° C., for example, and even more preferably 700 to 800° C. If the single crystal is grown by the above-mentioned temperature gradient method, the above-mentioned high temperature region preferably is at least 800° C., for example, and even more preferably at least 850° C., and the above-mentioned low temperature region preferably is 600 to 850° C., for example, and even more preferably 700 to 850° C. When 3C—SiC single crystal is produced by the producing method of the present invention, the heating temperature in the growth region preferably is 850 to 1000° C., for example, and even more preferably 850 to 950° C. When single crystal is grown by the above-mentioned temperature lowering method, the initial growth temperature preferably is 900 to 1000° C., for example. This initial temperature preferably is held for 1 to 100 hours, for example, and even more preferably 10 to 50 hours. The temperature then is gradually lowered from the initial temperature while the single crystal is grown, and the final temperature preferably is set to between 850 and 950° C., for example. If the single crystal is grown by the above-mentioned temperature gradient method, the above-mentioned high temperature region preferably is at least 950° C., for example, and even more preferably at least 1000° C., and the above-mentioned low temperature region preferably is 850 to 1000° C., for example, and even more preferably 850 to 950° C. Also, increasing the growth temperature allows silicon carbide single crystal, such as 4H—SiC single crystal or 6H—SiC single crystal, to be grown at a lower temperature than in conventional examples. Thus, with the producing method of the present invention, silicon carbide single crystal can be produced or grown at a lower temperature than in conventional examples. These temperature ranges are just examples, and the present invention is not limited thereto, and the heating temperature can be set suitably as dictated by other conditions, for example.

Next, examples of the present invention will be described, although the present invention is not limited to the following examples.

EXAMPLE 1

Figure 2:
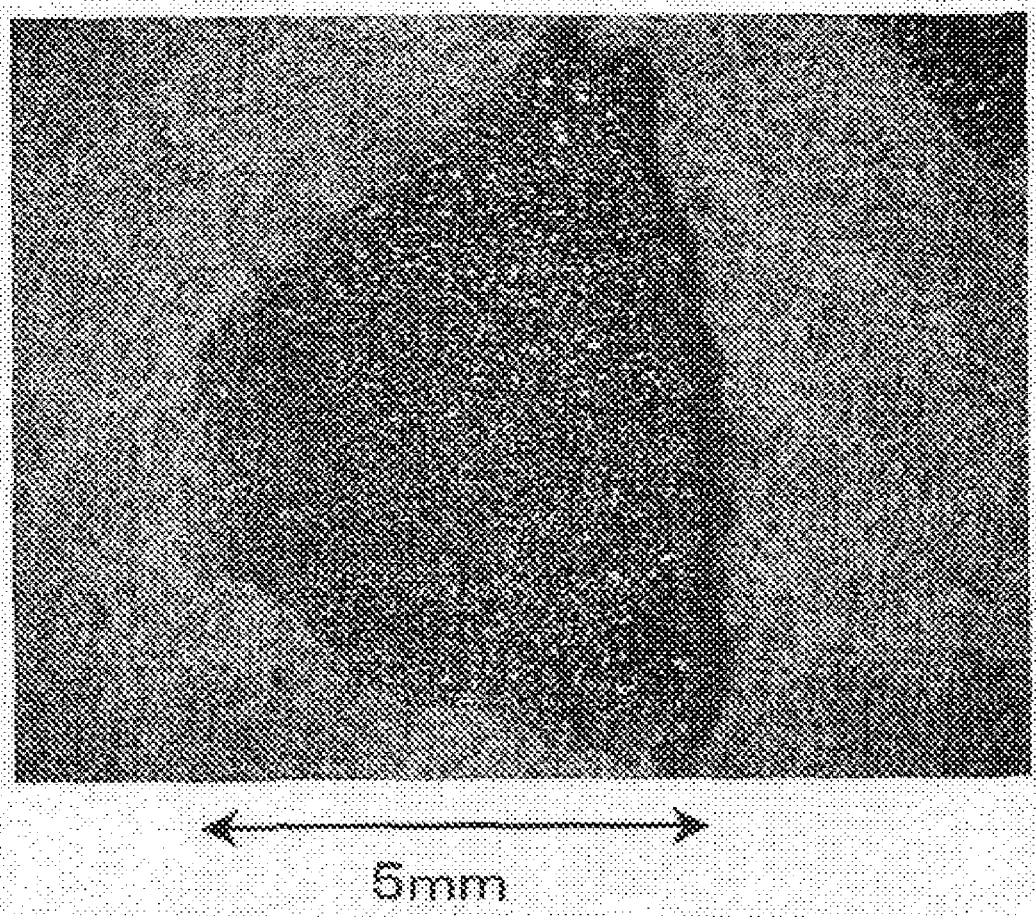
FIG. 2 is a micrograph of a cluster of SiC single crystals obtained in an example of the producing method of the present invention.
Figure 3A:
FIG. 3A and FIG. 3B are enlarged micrographs of the above-mentioned SiC single crystal.
Figure 3B:
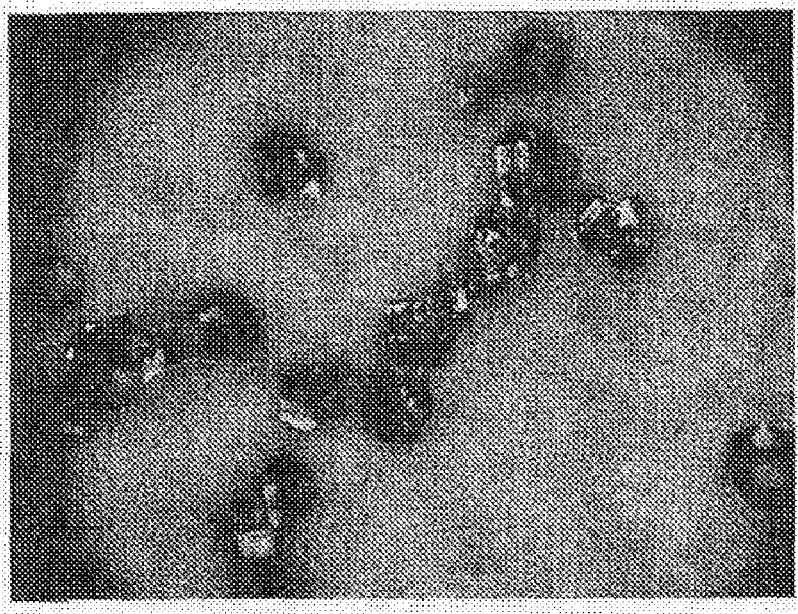
Figure 4:
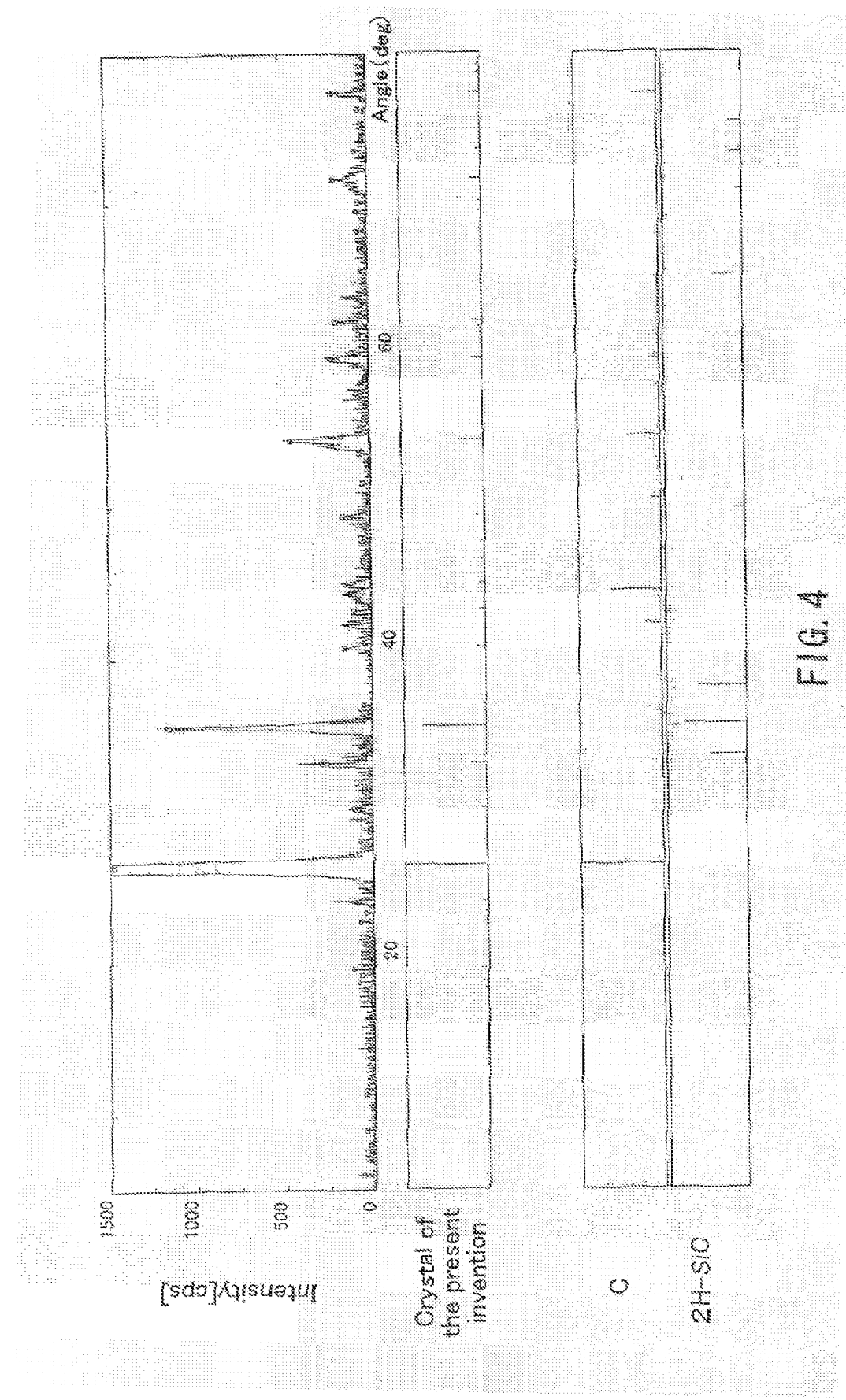
FIG. 4 is a chart of the results of X-ray diffraction evaluation of the product in a crucible in the above-mentioned example.
Figure 5A:
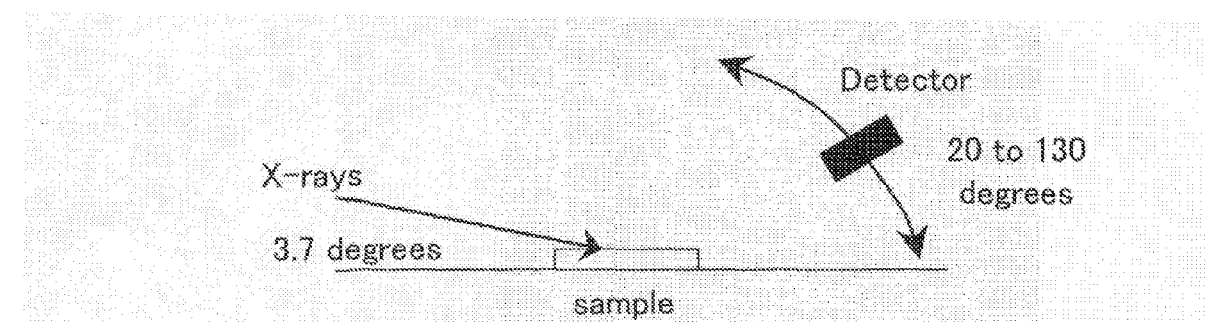
FIG. 5A is a schematic view showing the method employed for the X-ray diffraction.
Figure 5B:
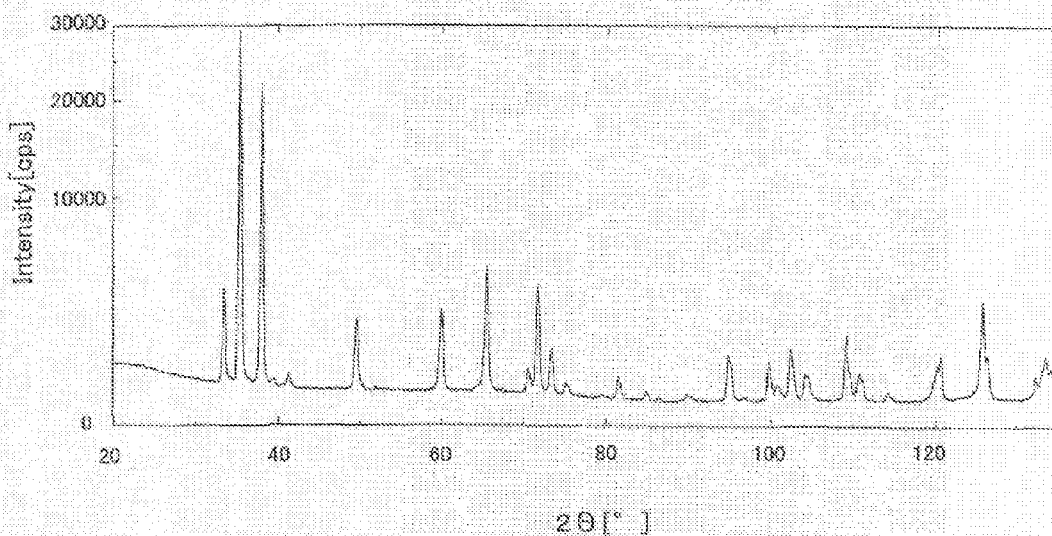
FIG. 5B is a chart of the results of X-ray diffraction evaluation of the above-mentioned SiC single crystal.
Figure 6:
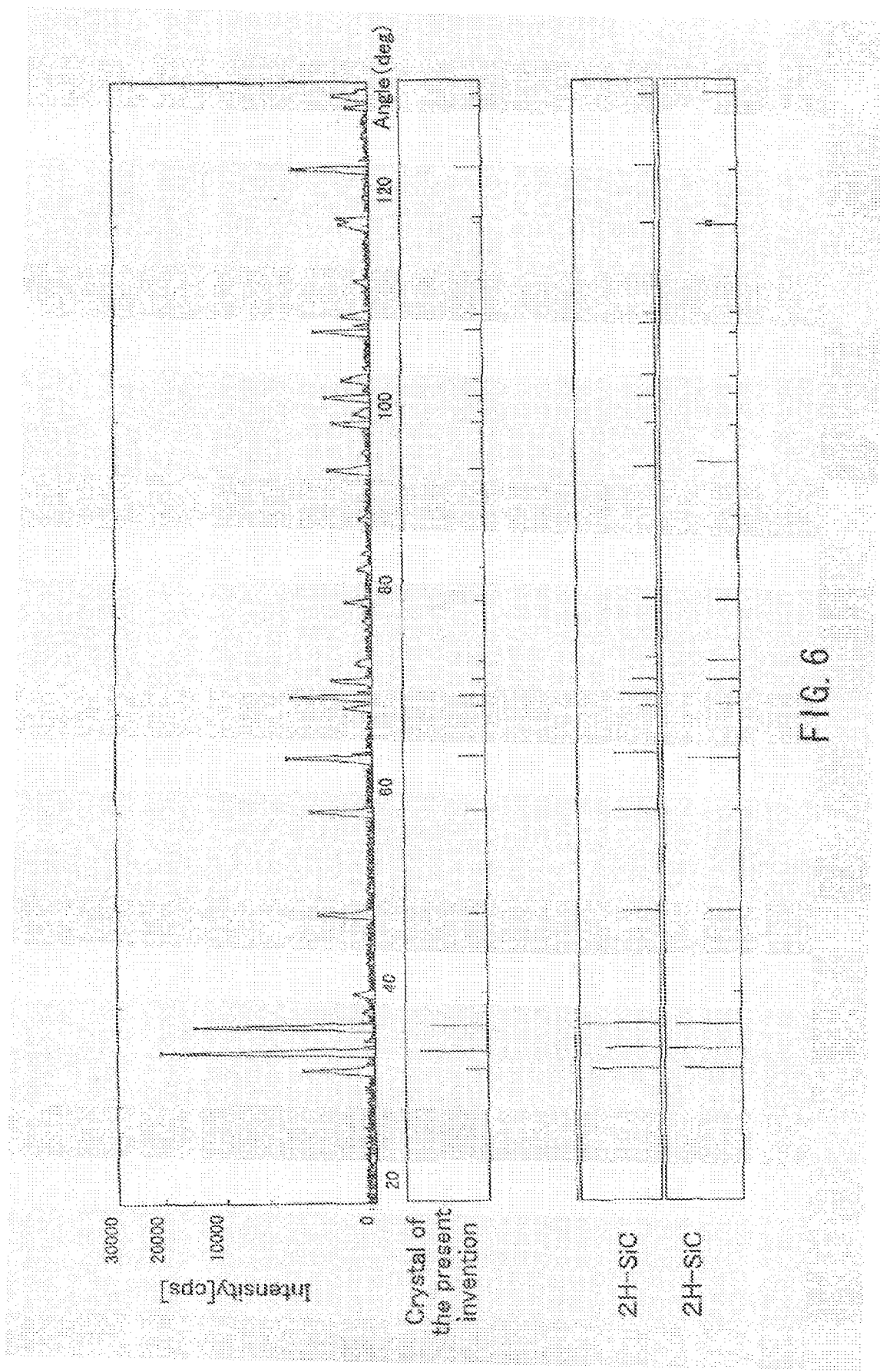
FIG. 6 is another chart of the results of X-ray diffraction evaluation of the above-mentioned single crystal.
Figure 7:
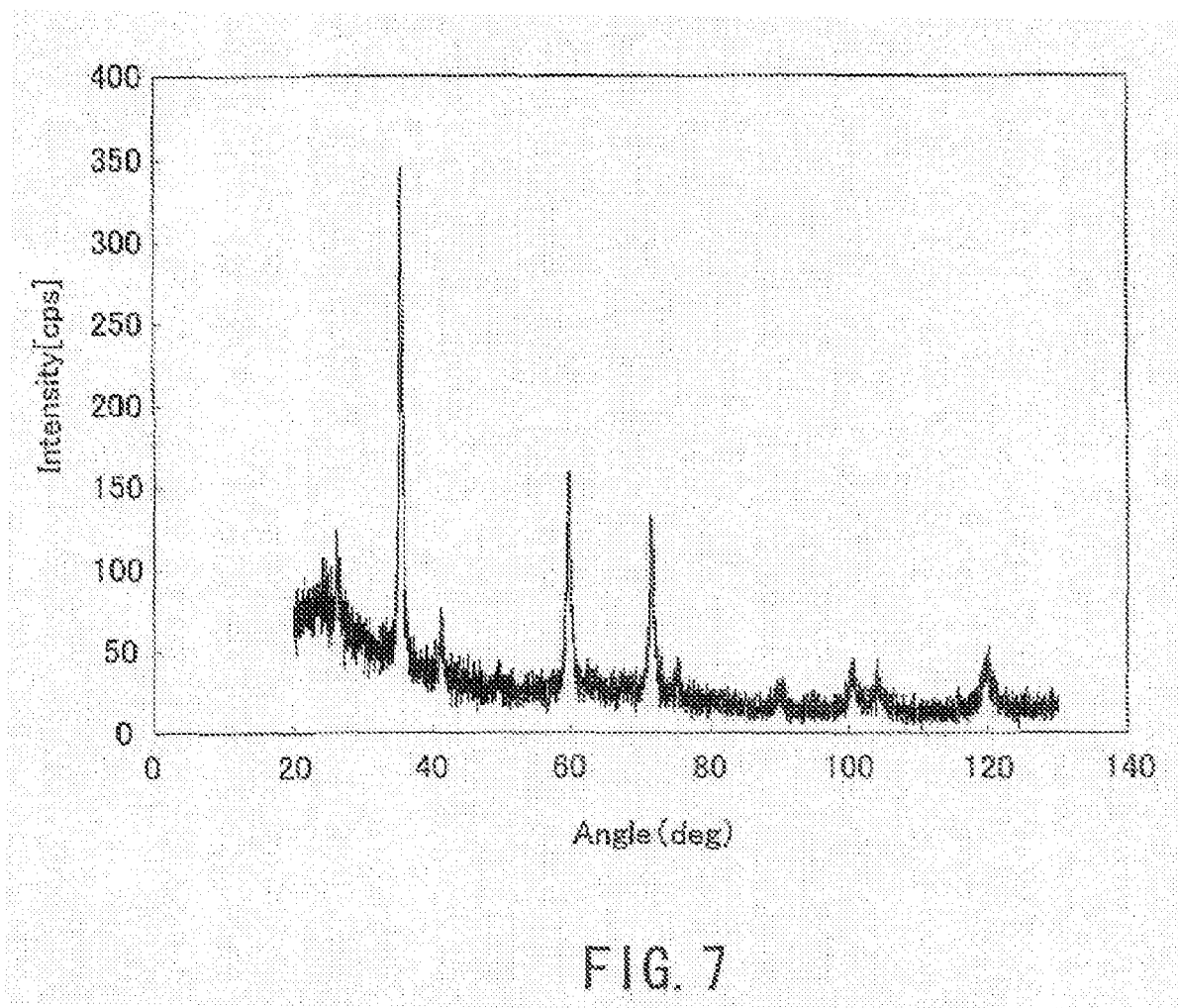
FIG. 7 is a chart of the results of X-ray diffraction evaluation of the product obtained in another example of the present invention.

This example is an example of producing silicon carbide (SiC) single crystal using the crystal growth apparatus shown in FIGS. 1A and 1B. The electric furnace 14 was made up of a resistance heater and a heat insulating material. The pressure- and heat-resistant vessel 13 was disposed inside the electric furnace 14, and a tungsten (W) crucible 15 was disposed inside the pressure- and heat-resistant vessel 13. A high-purity graphite crucible was disposed inside the crucible 15, and 1.2 g (0.1739 mol) of metallic lithium (Li) and 1.1 g (0.039 mol) of silicon (Si) were disposed in this graphite crucible. The carbon (C) that served as the raw material of the crystal was supplied from the material of which the graphite crucible was made. The interior of the pressure- and heat-resistant vessel 13 was replaced with an argon atmosphere, and the atmosphere inside the pressure- and heat-resistant vessel 13 was adjusted to the desired pressure with argon gas supplied from the gas cylinder 11. Next, the temperature inside the electric furnace 14 was raised to 850° C., which dissolved the lithium and formed a flux (melt), and this temperature was held for 24 hours so that the silicon and carbon would be dissolved to saturation in the lithium flux. After this, cooling was continued for 72 hours down to 700° C. Then, everything was allowed to cool naturally down to room temperature, which yielded the desired silicon carbide single crystal. Micrographs of the single crystal thus obtained are shown in FIGS. 2, 3A, and 3B. FIG. 2 shows a cluster of silicon carbide single crystals formed on the side walls of the graphite crucible, and FIGS. 3A and 3B are enlarged views of the resulting silicon carbide single crystals. First, the product inside the crucible was taken out and was pulverized and this powder was subjected to X-ray diffraction evaluation. These results are given in FIG. 4. FIG. 4 is a chart of the results of an ω/2θ scan (rotation of crystal and detector). As shown in FIG. 4, diffraction peaks coinciding with the peak data for 2H—SiC were confirmed, so the resulting single crystal further was subjected to X-ray diffraction evaluation by the parallel beam method shown schematically in FIG. 6A. As shown in FIG. 6A, this evaluation involved having the X-rays incident from 3.7 degrees, and using a detector to detect diffracted light from the single crystal. A solar slit for extracting only parallel beams was disposed ahead of the detector, and a signal was detected at high resolution. The chart in FIG. 5B shows the results of this analysis. FIG. 6 is the peak data obtained by removing the background from the chart of FIG. 5B. As shown in FIG. 6, this evaluation gave diffraction peaks that matched up with the peak data for 2H—SiC. These results confirmed that the above-mentioned single crystal was 2H—SiC single crystal. There is no particular limitation on the above-mentioned X-ray source, but a CuKα line can be used, for example. Nor is there any particular limitation on first crystal used in the above-mentioned X-ray diffraction, and InP crystals, germanium crystals, or the like can be used, for example.

EXAMPLE 2

Silicon carbide single crystal was produced in the same manner as in Example 1, except that the temperature inside the electric furnace 14 was raised to 950° C. and held for 24 hours, and cooling was performed for 72 hours down to 850° C. The product thus obtained inside the crucible was evaluated by X-ray diffraction in the same manner as in Example 1. These analysis results are given in the chart in FIG. 9. These results confirm the production of 3C—SiC single crystal.

INDUSTRIAL APPLICABILITY

As discussed above, the producing method of the present invention makes it possible to produce large silicon carbide single crystal at low cost. Also, the producing method of the present invention makes it possible to produce large, bulk silicon carbide single crystals at low cost, for example. The silicon carbide single crystal obtained with the producing method of the present invention can be used preferably in semiconductor devices used for energy devices and onboard power devices, although their application is wide and not limited to these.

The invention claimed is:

1. A method for producing a silicon carbide (SiC) single crystal, wherein a simple substance of silicon (Si) and carbon (C) are heated at 1000° C. or lower, and are dissolved in an alkali metal flux, and are reacted to produce or grow the silicon carbide single crystal.

2. The producing method according to claim 1, wherein the silicon carbide single crystal is a 2H—SiC single crystal or a 3C—SiC single crystal.

3. The producing method according to claim 1, wherein the silicon carbide single crystal is produced or grown by cooling the alkali metal flux in which the silicon and the carbon are dissolved.

4. The producing method according to claim 3, wherein the silicon and the carbon are dissolved in the alkali metal flux by heating the silicon, the carbon, and the alkali metal, and the heated state is maintained for a specific length of time, and then the heating temperature is lowered to cool the alkali metal flux.

5. The producing method according to claim 1, wherein a temperature gradient is formed in the alkali metal flux, the silicon and the carbon are dissolved in a high-temperature region of the temperature gradient, and the silicon carbide single crystal is produced or grown in a low-temperature region of the temperature gradient.

6. The producing method according to claim 1, wherein the alkali metal is at least one selected from the group consisting of lithium (Li), sodium (Na), and potassium (K).

7. The producing method according to claim 1, wherein the alkali metal is lithium (Li).

8. The producing method according to claim 1, wherein the alkali metal flux further includes an alkaline earth metal.

9. The producing method according to claim 1, wherein the reaction is conducted in a reaction vessel, and the carbon is supplied from a material from which the reaction vessel is formed.

10. The producing method according to claim 9, wherein the reaction vessel is formed from a carbon-based material.

11. The producing method according to claim 10, wherein the carbon-based material is graphite.

12. The producing method according to claim 1, wherein a silicon carbide crystal is produced beforehand as a seed crystal, and the seed crystal is used as a nucleus to grow new silicon abide single crystal.

13. The producing method according to claim 1, wherein the silicon carbide single crystal is produced or grown under a pressurized atmosphere.

14. The producing method according to claim 1, wherein the silicon carbide single crystal is produced or grown under an inert gas atmosphere.

15. The producing method according to claim 14, wherein the inert gas is at least one of argon (Ar) gas and a hydrocarbon gas.

16. The producing method according to claim 15, wherein the hydrocarbon gas is at least one of methane gas and propane gas.

17. The producing method according to claim 1, wherein the alkali metal flux further includes an impurity as dopant.

18. The producing method according to claim 1, wherein the silicon carbide single crystal is a 2H—SiC single crystal.

* * * * *